United States Patent
Ode et al.

(10) Patent No.: US 9,559,300 B2
(45) Date of Patent: Jan. 31, 2017

(54) RESISTIVE RANDOM ACCESS MEMORY DEVICE AND MANUFACTURING METHOD THEREOF

(71) Applicant: KABUSHIKI KAISHA TOSHIBA, Minato-ku (JP)

(72) Inventors: Hiroyuki Ode, Yokkaichi (JP); Takeshi Yamaguchi, Yokkaichi (JP); Takeshi Takagi, Yokkaichi (JP); Toshiharu Tanaka, Yokkaichi (JP); Masaki Yamato, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 55 days.

(21) Appl. No.: 14/472,670

(22) Filed: Aug. 29, 2014

(65) Prior Publication Data

US 2015/0083989 A1 Mar. 26, 2015

Related U.S. Application Data

(60) Provisional application No. 61/880,552, filed on Sep. 20, 2013.

(51) Int. Cl.
| | |
|---|---|
| *H01L 27/10* | (2006.01) |
| *H01L 45/00* | (2006.01) |
| *G11C 13/00* | (2006.01) |
| *G11C 11/419* | (2006.01) |
| *H01L 27/118* | (2006.01) |

(Continued)

(52) U.S. Cl.
CPC .......... *H01L 45/146* (2013.01); *G11C 11/419* (2013.01); *G11C 13/004* (2013.01);

(Continued)

(58) Field of Classification Search
CPC ............. G11C 13/0069; G11C 13/0007; G11C 13/004; G11C 2013/009; G11C 2213/51; G11C 2013/0073; G11C 2213/32; G11C 13/52; G11C 11/419; G11C 13/0009; G11C 2213/71; G11C 2013/70; G11C 2013/005; H01L 27/115; H01L 27/118; H01L 45/04; H01L 27/24; H01L 45/1233; H01L 45/146; H01L 45/085; H01L 27/11206; H01L 27/2409
See application file for complete search history.

(56) References Cited

U.S. PATENT DOCUMENTS

2001/0003664 A1* 6/2001 Yamaguchi ....... H01L 21/31604
438/240
2002/0114112 A1* 8/2002 Nakashio ............... B82Y 10/00
360/324.2

(Continued)

*Primary Examiner* — Fei Fei Yeung Lopez
(74) *Attorney, Agent, or Firm* — Oblon, McClelland, Maier & Neustadt, L.L.P.

(57) ABSTRACT

In accordance with an embodiment, a resistive random access memory device includes a substrate, first and second wiring lines, and a storage cell. The first and second wiring lines are disposed on the substrate so as to intersect each other. The storage cell is disposed between the first and second wiring lines at the intersection of the first and second wiring lines and includes a first electrode, a resistive switching film on the first electrode, a second electrode on the resistive switching film, and a tantalum oxide ($TaO_x$) layer. The first electrode is electrically connected to the first wiring line. The second electrode is electrically connected to the second wiring line. The tantalum oxide ($TaO_x$) layer is disposed between the first electrode and the resistive switching film and is in contact with the resistive switching film.

10 Claims, 18 Drawing Sheets

(51) Int. Cl.
*H01L 27/115* (2006.01)
*H01L 27/24* (2006.01)
*H01L 27/112* (2006.01)

(52) U.S. Cl.
CPC ...... *G11C 13/0007* (2013.01); *G11C 13/0009* (2013.01); *G11C 13/0069* (2013.01); *H01L 27/115* (2013.01); *H01L 27/118* (2013.01); *H01L 27/11206* (2013.01); *H01L 27/24* (2013.01); *H01L 27/2409* (2013.01); *H01L 27/249* (2013.01); *H01L 45/04* (2013.01); *H01L 45/085* (2013.01); *H01L 45/12* (2013.01); *H01L 45/1233* (2013.01); *H01L 45/1253* (2013.01); *H01L 45/16* (2013.01); *G11C 2013/005* (2013.01); *G11C 2013/009* (2013.01); *G11C 2013/0073* (2013.01); *G11C 2213/32* (2013.01); *G11C 2213/51* (2013.01); *G11C 2213/52* (2013.01); *G11C 2213/71* (2013.01)

(56) References Cited

U.S. PATENT DOCUMENTS

| | | | |
|---|---|---|---|
| 2003/0179974 A1* | 9/2003 | Estes | B82Y 20/00 385/2 |
| 2006/0003517 A1* | 1/2006 | Ahn et al. | 438/216 |
| 2008/0278990 A1* | 11/2008 | Kumar et al. | 365/148 |
| 2009/0250678 A1* | 10/2009 | Osano | G11C 13/0007 257/2 |
| 2009/0272961 A1* | 11/2009 | Miller et al. | 257/4 |
| 2010/0155690 A1* | 6/2010 | Napolitano | G11C 13/0014 257/5 |
| 2011/0122680 A1* | 5/2011 | Ikeda et al. | 365/148 |
| 2014/0042380 A1* | 2/2014 | Kim | H01L 45/145 257/2 |
| 2014/0264239 A1* | 9/2014 | Ananthan et al. | 257/4 |
| 2014/0269002 A1* | 9/2014 | Jo | H01L 45/145 365/148 |

* cited by examiner

RESISTIVE RANDOM ACCESS MEMORY DEVICE AND MANUFACTURING METHOD THEREOF

CROSS REFERENCE TO RELATED APPLICATIONS

This application is based upon and claims the benefit of U.S. provisional Application No. 61/880,552, filed on Sep. 20, 2013, the entire contents of which are incorporated herein by reference.

FIELD

Embodiments described herein relate generally to a resistive random access memory device and a manufacturing method thereof.

BACKGROUND

In order to reduce current consumption in a resistive random access memory (hereinafter briefly referred to as a "ReRAM") a smaller value has been required as a switching current (a current necessary to shift a resistive element from a high-resistance state into a low-resistance state or to shift the resistive element from the low-resistance state into the high-resistance state). Thus, there has been needed a resistive switching film capable of a switching operation even with a several-μA-level current.

DETAILED DESCRIPTION

In accordance with an embodiment, a resistive random access memory device includes a substrate, first and second wiring lines, and a storage cell. The first and second wiring lines are disposed on the substrate so as to intersect each other. The storage cell is disposed between the first and second wiring lines at the intersection of the first and second wiring lines and includes a first electrode, a resistive switching film on the first electrode, a second electrode on the resistive switching film, and a tantalum oxide ($TaO_x$) layer. The first electrode is electrically connected to the first wiring line. The second electrode is electrically connected to the second wiring line. The tantalum oxide ($TaO_x$) layer is disposed between the first electrode and the resistive switching film and is in contact with the resistive switching film.

Embodiments will now be explained with reference to the accompanying drawings. Like components are provided with like reference signs throughout the drawings and repeated descriptions thereof are appropriately omitted. It is to be noted that each of the accompanying drawings is prepared to illustrate the invention and to assist in the understanding of the illustration and that the shapes, dimensions, and ratios in each of the drawings are different in some parts from those in an actual apparatus.

In the present specification, "stacking" not only includes stacking layers in contact with each other but also includes staking layers with another layer interposed therebetween. "Providing on" not only includes providing a layer in direct contact with a layer but also includes providing a first layer on a second layer with a third layer interposed between the first and second layers. Moreover, a "main surface" refers to a surface of a substrate in which elements are formed.

(1) Resistive Random Access Memory Device According to Embodiment 1

Figure 1:
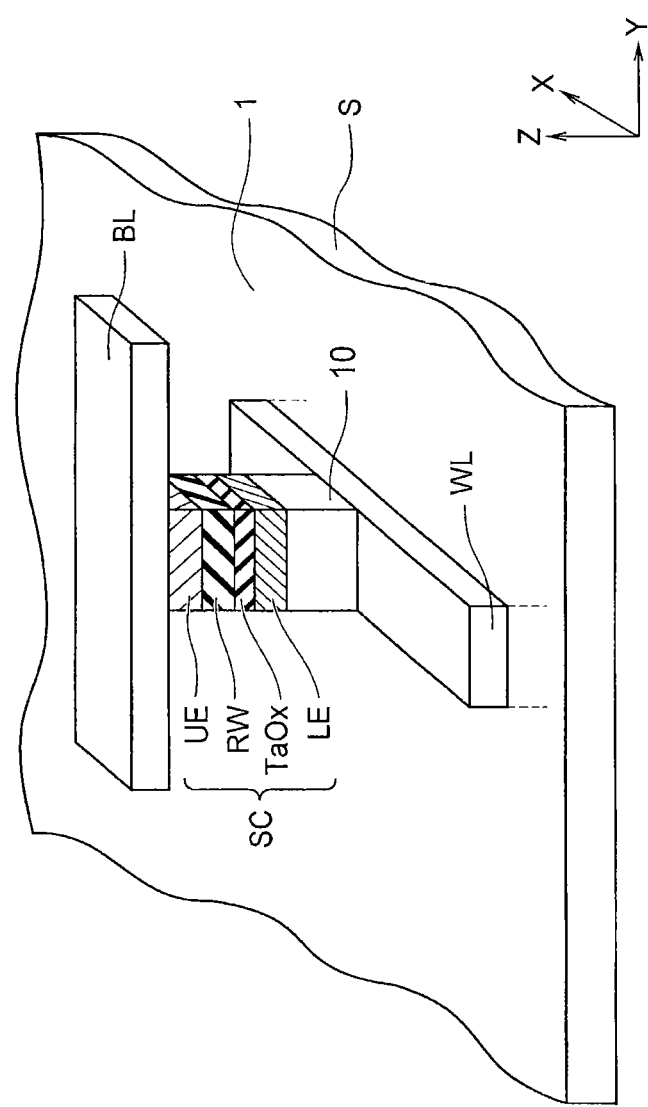
FIG. 1 is an example of a perspective view showing the general configuration of a main part of a resistive random access memory device according to Embodiment 1.
Figure 2:
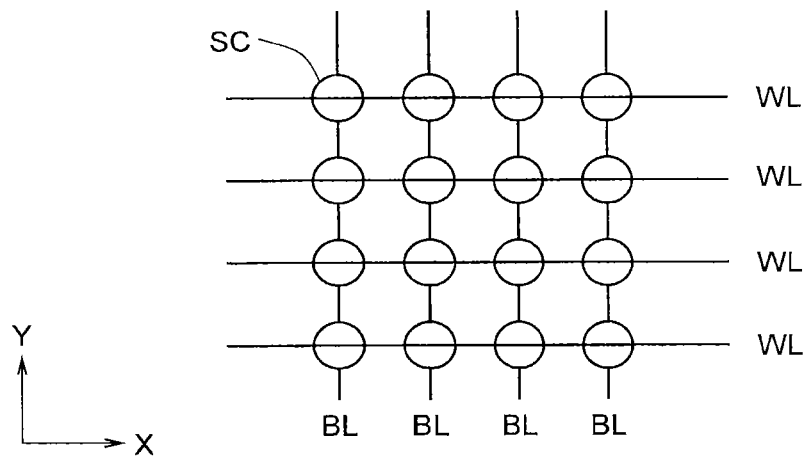
FIG. 2 is an example of a plan view showing the general configuration of the planar cross-point resistive random access memory device shown in FIG. 1.

FIG. 1 is an example of a perspective view showing the general configuration of the resistive random access memory device according to Embodiment 1. FIG. 2 is a schematic plan view thereof.

As shown in FIG. 1 and FIG. 2, the resistive random access memory device according to the present embodiment includes a substrate S, a word line WL, a current control element 10, a resistance change storage cell SC, and a bit line BL.

Although a silicon wafer is used as the substrate S in the present embodiment, the substrate S is not limited to this semiconductor substrate, and an insulating substrate such as a glass substrate or a ceramic substrate can also be used.

The word lines WL extend in one direction, in FIG. 1, in the X-direction in a plane which is level with a main surface 1 of the substrate S, and are repetitively arranged on the substrate S at a predetermined pitch in a Y-direction perpendicular to the X-direction in the main surface 1.

The bit lines BL extend in the Y-direction in the present embodiment, and are repetitively arranged on the word lines WL at a predetermined pitch in the X-direction. Thus, the word lines WL and the bit lines BL are arranged in matrix form when viewed from the top. In the present embodiment, the word line WL and the bit line BL correspond to, for example, first and second wiring lines, respectively.

A stack of the current control element 10 and the resistance change storage cell SC is provided at each intersection of the word line WL and the bit line BL.

In the present embodiment, the resistance change storage cell SC includes a lower electrode LE, a resistive switching film RW made of hafnium oxide ($HfO_x$), and an upper electrode UE. The lower electrode LE is electrically connected to the word line WL via the current control element 10, and the upper electrode UE is electrically connected to the bit line BL. In the present embodiment, the lower electrode LE corresponds to, for example, a first electrode, and the upper electrode UE corresponds to, for example, a second electrode.

A plurality of stages of the above-mentioned configuration are repetitively formed in a normal direction of the main surface 1 of the substrate S, that is, in a Z-direction. Thus, the resistive random access memory device according to the present embodiment constitutes a memory device having a planar cross-point type three-dimensional structure.

The current control element 10 comprises, for example, a diode having a semiconductor.

Although not specifically shown, a control circuit to select a given resistance change storage cell SC during reading and writing is disposed between the substrate S and the word line WL. This control circuit can control whether or not to select the resistance change storage cell SC by adjusting voltages to be applied to the word line and the bit line in consideration of the characteristics of the current control element 10, and enables a switching operation in a cross-point array.

Figure 3:
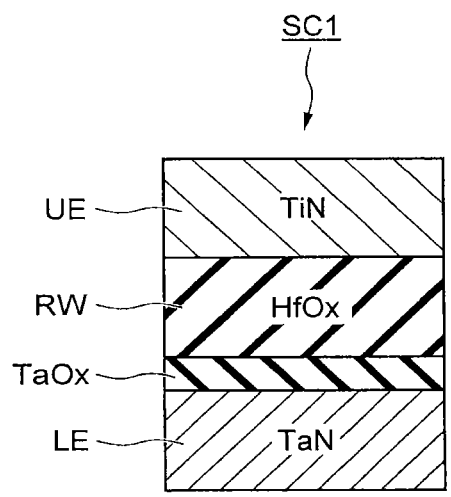
FIG. 3 is an example of a front view showing the detailed configuration of a storage cell of the planar cross-point resistive random access memory device shown in FIG. 1.

A more detailed configuration of the resistance change storage cell SC is described with reference to FIG. 3. As shown in FIG. 3, in a resistance change storage cell SC1 constituting the resistive random access memory device according to the present embodiment, the lower electrode LE is made of tantalum nitride (TaN), and the upper electrode UE is made of titanium nitride (TiN).

Tantalum oxide ($TaO_x$) is disposed between the resistive switching film RW and the lower electrode LE. Tantalum oxide ($TaO_x$) has one surface in contact with the resistive switching film RW, and the other surface in contact with tantalum nitride (TaN). It can be understood that tantalum oxide ($TaO_x$) is a part of the resistive switching film RW (an interfacial layer of the resistive switching film RW) when having an influence on the resistance change.

The thickness of the tantalum oxide ($TaO_x$) layer has only to range from 0.1 nm to 3.0 nm, and preferably range from 0.1 nm to 2.0 nm.

In the vicinity of an interface between the tantalum oxide ($TaO_x$) layer and the resistive switching film RW, the composition ratio between (Ta) and oxygen (O) in the tantalum oxide ($TaO_x$) layer is preferably close to a stoichiometric value x=2.5.

Figure 4:
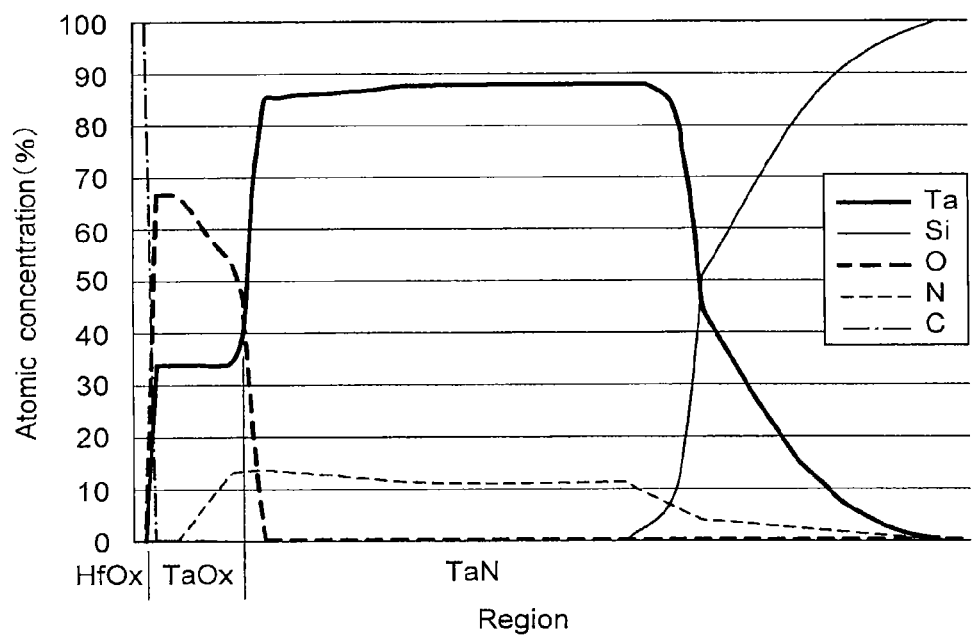
FIG. 4 is a graph showing an example of a composition ratio in which a low-current operation is observed in the storage cell having the configuration shown FIG. 3.

A graph in FIG. 4 shows an example of a composition ratio in which a switching operation is observed at a low current in the storage cell SC1 having a configuration shown in FIG. 3. The vertical line in FIG. 4 indicates an element concentration of each lay. The left end corresponds to the resistance change element ($HfO_x$). In the graph in FIG. 4, the value of x of tantalum oxide ($TaO_x$) is within a range of about $2.0 \le x \le 2.5$. The composition ratio between tantalum (Ta) and oxygen (O) in the tantalum oxide ($TaO_x$) layer in the vicinity of an interface between the tantalum oxide ($TaO_x$) layer and the resistive switching film RW is close to a stoichiometric value x=2.5.

The ratio of oxygen in tantalum oxide ($TaO_x$) is lower at an interface between tantalum nitride (TaN) and tantalum oxide ($TaO_x$), and gradually becomes higher when the resistive switching film RW is closer.

Tantalum oxide ($TaO_x$) may contain nitrogen. The amount of nitrogen contained in tantalum oxide ($TaO_x$) is smaller than the amount of oxygen. The concentration of nitrogen is higher at the interface between tantalum nitride (TaN) and tantalum oxide ($TaO_x$), and the ratio gradually becomes lower when the resistive switching film RW comes closer.

The configuration of the resistance change storage cell SC is not limited to the form shown in FIG. 3, and can be variously modified.

Figure 5:
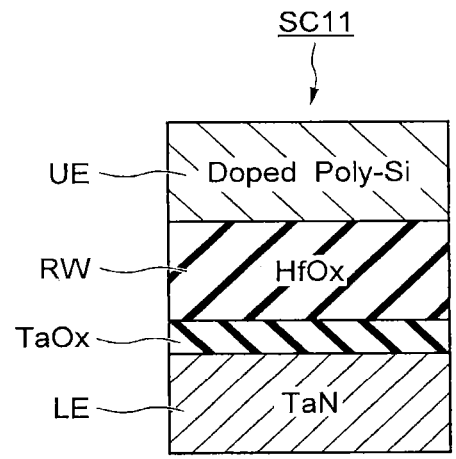
FIG. 5 to FIG. 19 are examples of diagrams showing a modification of the planar cross-point resistive random access memory device shown in FIG. 1.
Figure 6:
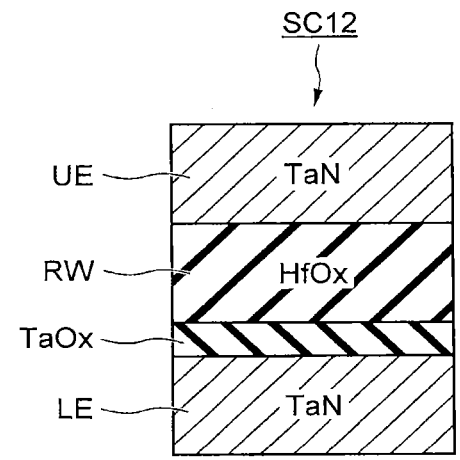
Figure 7:
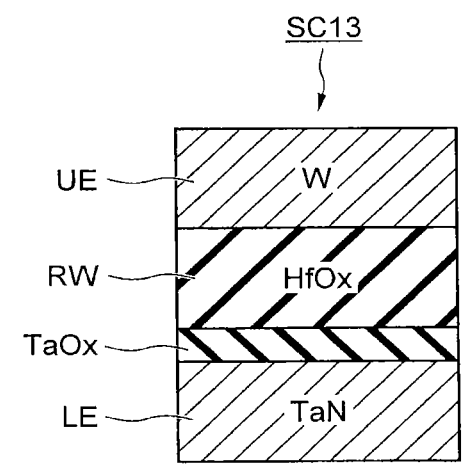

For example, in the configuration shown in FIG. 3, the material of the upper electrode UE can be changed from tantalum nitride (TaN) to some other conductor. In the examples of resistance change storage cells SC11 to SC13 shown in FIG. 5 to FIG. 7, polysilicon doped with an impurity (doped poly-Si), tantalum nitride (TaN), and tungsten (W) as the upper electrode UE are used.

In the configuration shown in FIG. 3, the material of the lower electrode LE can be changed from tantalum nitride (TaN) to some other conductor.

Resistance change storage cells SC20 to SC23 shown in FIG. 8 to FIG. 11 are examples in which the material of the lower electrode LE in SC1 and SC11 to SC13 respectively shown in FIG. 3 and FIG. 5 to FIG. 7 are changed from tantalum nitride (TaN) to titanium nitride (TiN).

Resistance change storage cells SC30 to SC33 shown in FIG. 12 to FIG. 15 are examples in which the material of the lower electrode LE in SC20 to SC23 respectively shown in FIG. 8 to FIG. 11 is changed from titanium nitride (TiN) to polysilicon doped with an impurity (doped poly-Si).

Resistance change storage cells SC40 to SC43 shown in FIG. 16 to FIG. 19 are examples in which the material of the lower electrode LE in SC20 to SC23 respectively shown in FIG. 8 to FIG. 11 is changed from titanium nitride (TiN) to tungsten (W).

Tungsten nitride (WN) can also be used as the material of the upper electrode UE and the lower electrode LE.

Figure 37:
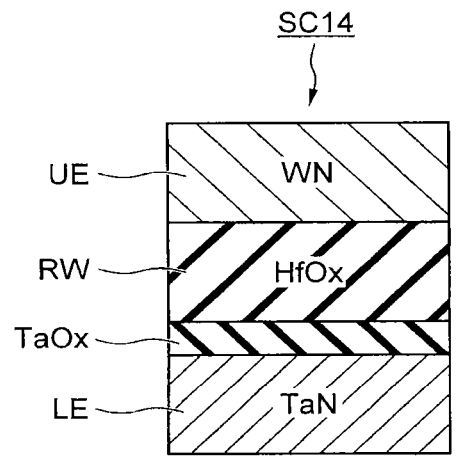
FIG. 37 to FIG. 45 are examples of diagrams showing another modification of the planar cross-point resistive random access memory device shown in FIG. 1.

A resistance change storage cell SC14 shown in FIG. 37 is an example in which the material of the upper electrode UE of the resistance change storage cell SC1 shown in FIG. 3 is changed from titanium nitride (TiN) to tungsten nitride (WN).

Figure 8:
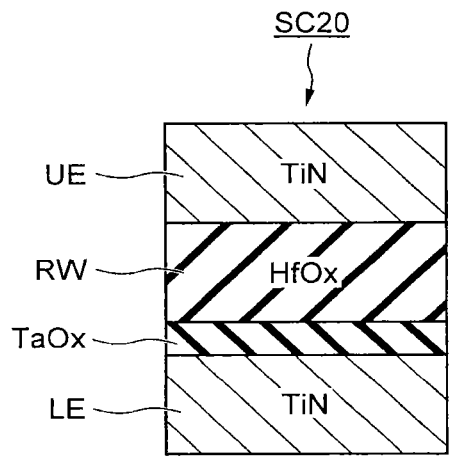
Figure 9:
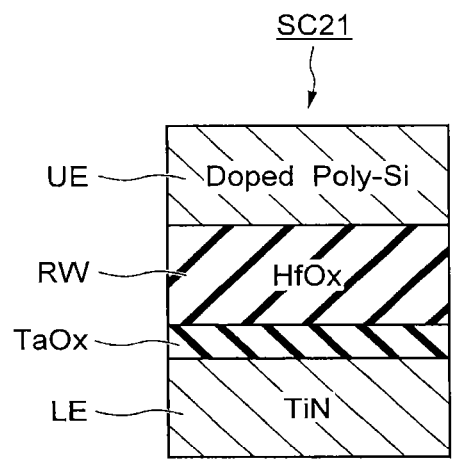
Figure 10:
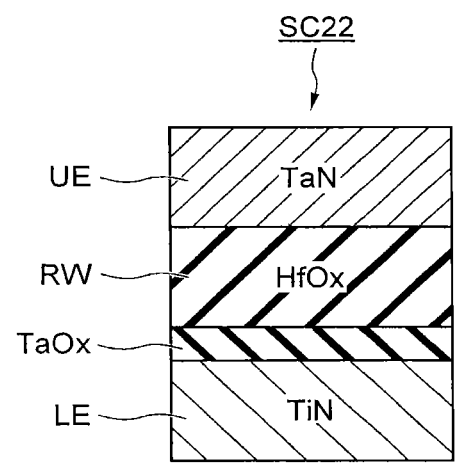
Figure 11:
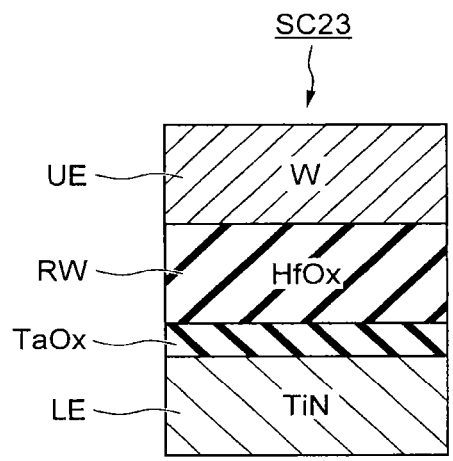
Figure 38:
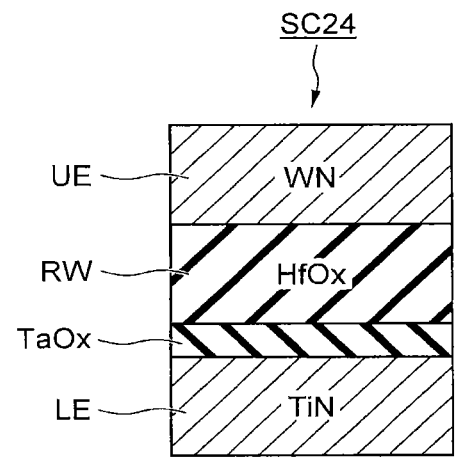

A resistance change storage cell SC24 shown in FIG. 38 is an example in which the material of the upper electrode UE of the resistance change storage cell SC20 shown in FIG. 8 is changed from titanium nitride (TiN) to tungsten nitride (WN).

Figure 12:
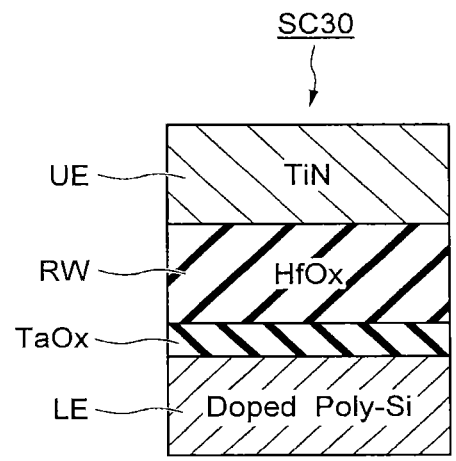
Figure 13:
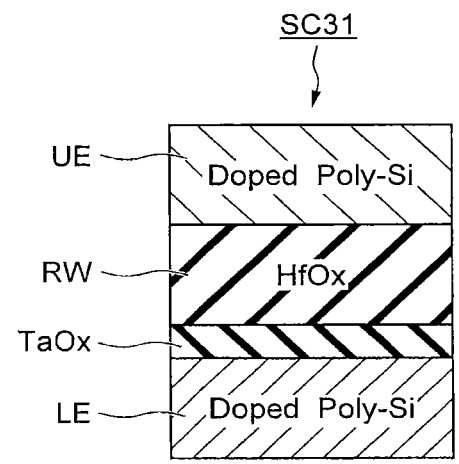
Figure 14:
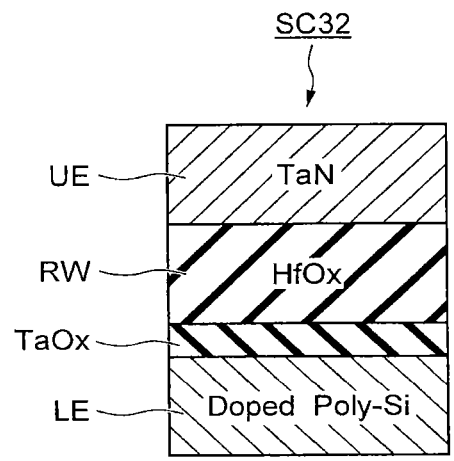
Figure 15:
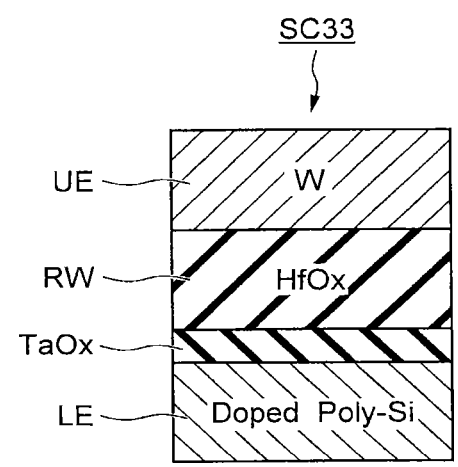
Figure 39:
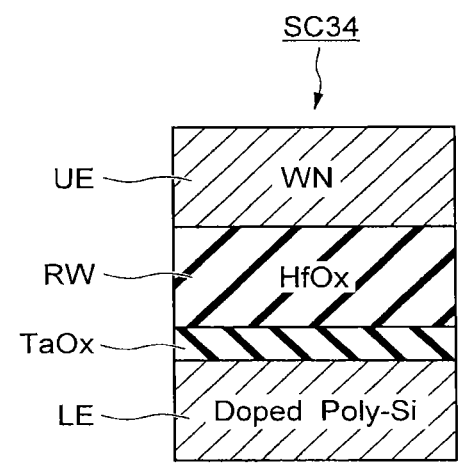

A resistance change storage cell SC34 shown in FIG. 39 is an example in which the material of the upper electrode UE of the resistance change storage cell SC30 shown in FIG. 12 is changed from titanium nitride (TiN) to tungsten nitride (WN).

Figure 16:
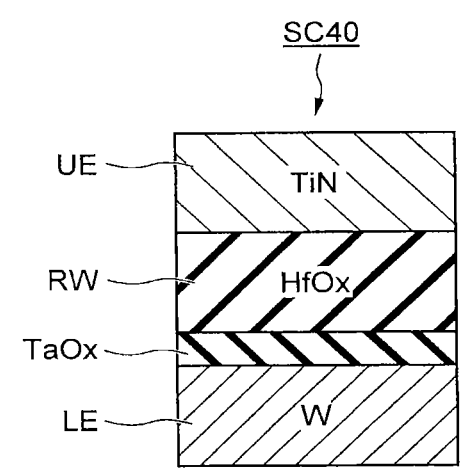
Figure 17:
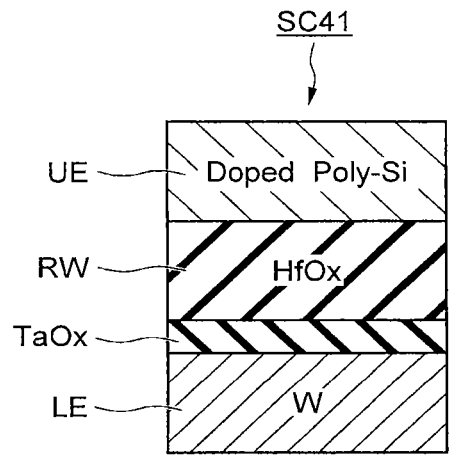
Figure 18:
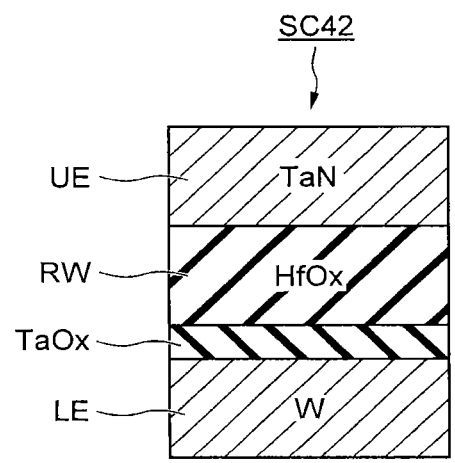
Figure 19:
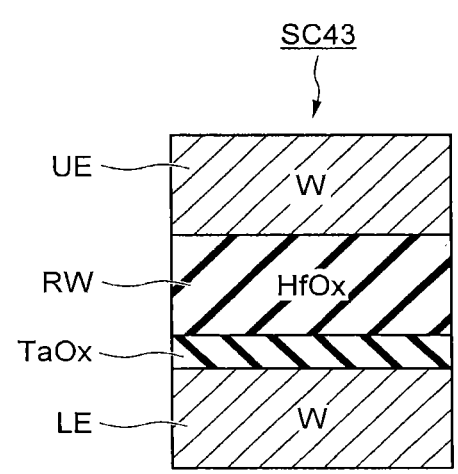
Figure 40:
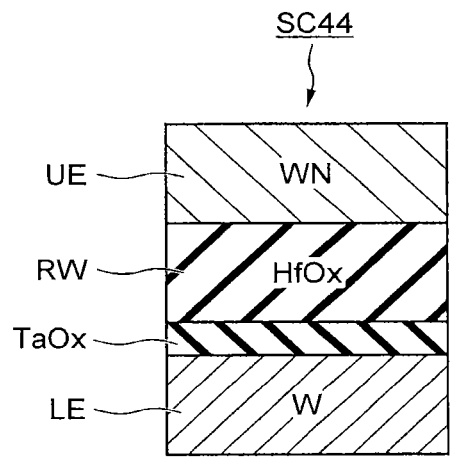

A resistance change storage cell SC44 shown in FIG. 40 is an example in which the material of the upper electrode UE of the resistance change storage cell SC40 shown in FIG. 16 is changed from titanium nitride (TiN) to tungsten nitride (WN).

Resistance change storage cells SC50 to SC53 respectively shown in FIG. 41 to FIG. 44 are examples in which the material of the lower electrode LE in the resistance change storage cells SC40 to SC43 respectively shown in FIG. 16 to FIG. 19 is changed from tungsten (W) to tungsten nitride (WN).

Figure 41:
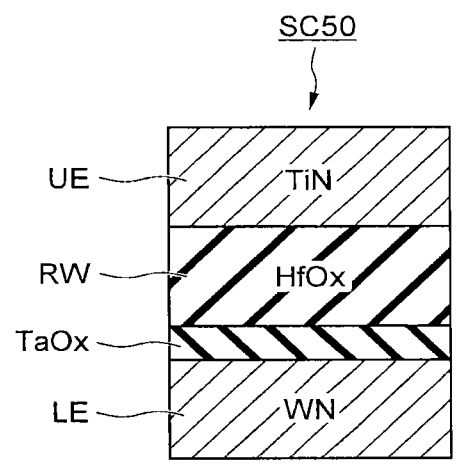
Figure 42:
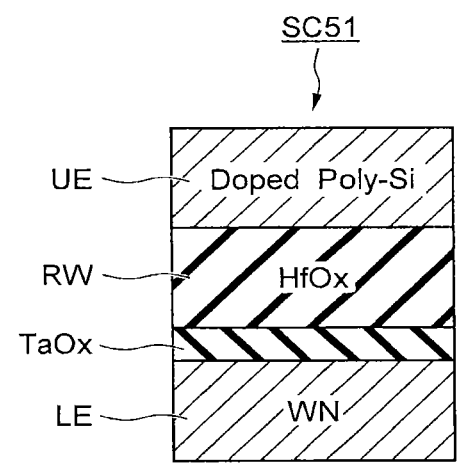
Figure 43:
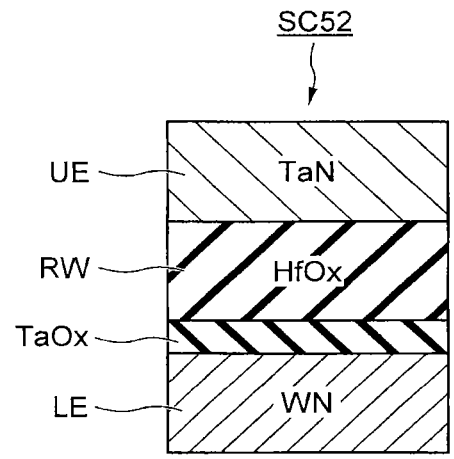
Figure 44:
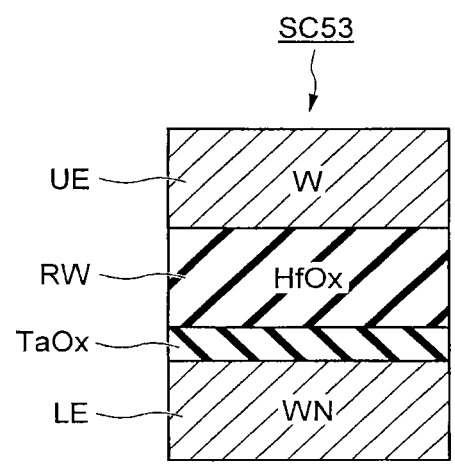
Figure 45:
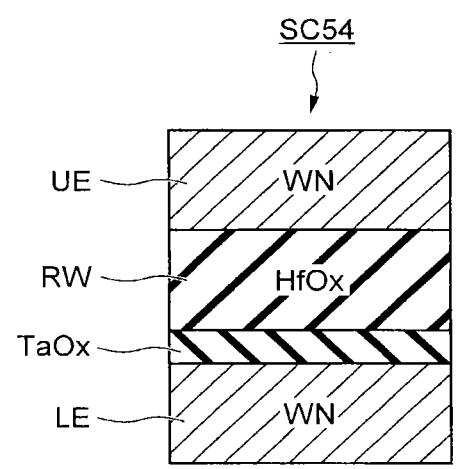

Moreover, a resistance change storage cell SC54 shown in FIG. 45 is an example in which the material of the upper electrode UE of the resistance change storage cell SC50 shown in FIG. 41 is changed from titanium nitride (TiN) to tungsten nitride (WN).

Although tungsten (W) and tungsten nitride (WN) are used as the metallic materials of the upper electrode UE and the lower electrode LE in the example described above, it should be understood that the materials are not limited thereto and other metals can also be used.

Each of the configuration examples of the resistance change storage cells SC described above can be appropriately turned upside down and used, for example, in accordance with the configurations of peripheral circuits.

The above-described resistive random access memory device according to Embodiment 1 includes the tantalum oxide ($TaO_x$) layer in contact with the resistive switching film RW. As a result, the switching operation at a low current is possible. Since the switching operation at a low current can be performed, data retention characteristics and endurance characteristics of the resistance change storage cell SC can be improved.

(2) Manufacturing Method of Resistive Random Access Memory Device

Now, several embodiments of manufacturing methods of the resistive random access memory device are described.

(i) Embodiment 1

A manufacturing method of a resistive random access memory device shown in FIG. 1 to FIG. 3 is first described with reference to FIG. 20 to FIG. 25.

Figure 20:
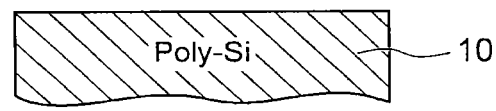
FIG. 20 to FIG. 24 are examples of schematic sectional views illustrating a manufacturing method of the resistive random access memory device according to Embodiment 1.

First, word lines WL (see FIG. 1) are formed on the substrate S (see FIG. 1), and current control elements 10 are formed on the word lines WL (FIG. 20). In the present embodiment, the current control elements 10 are PIN diodes in which silicon semiconductor layers doped with an impurity are used as an anode and a cathode. The same applies to manufacturing methods of other embodiments described later.

Figure 21:
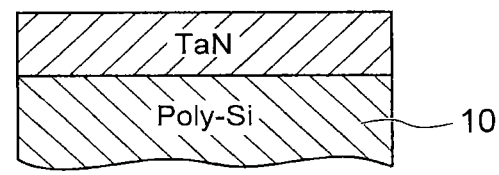

A tantalum nitride (TaN) layer to be a lower electrode LE is then formed on the current control elements 10 as shown in FIG. 21 by physical vapor deposition (hereinafter briefly referred to as "PVD"), chemical vapor deposition (hereinafter briefly referred to as "CVD"), or atomic layer deposition (hereinafter briefly referred to as "ALD").

Figure 22:
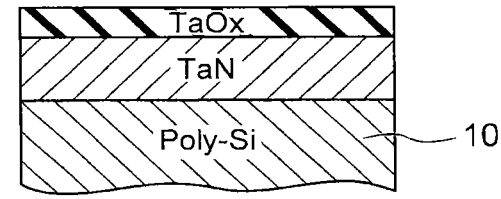

A tantalum oxide ($TaO_x$) layer is then formed on the tantalum nitride (TaN) layer as shown in FIG. 22 by surface oxidation of the tantalum nitride (TaN) layer based on various oxidation processes such as an ozone treatment and oxidation annealing, or by a film formation process that uses the PVD, the CVD, or the ALD.

Figure 23:
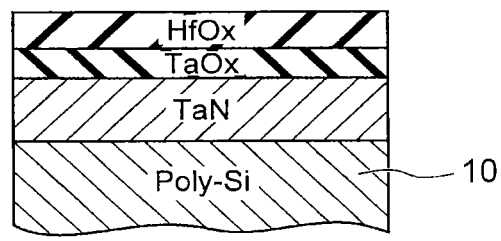

A hafnium oxide ($HfO_x$) film to be a resistive switching film RW is then formed on the tantalum oxide ($TaO_x$) layer as shown in FIG. 23 by the PVD, the CVD, or the ALD.

Figure 24:
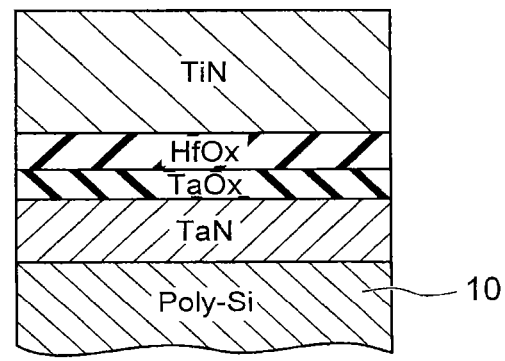
Figure 25:
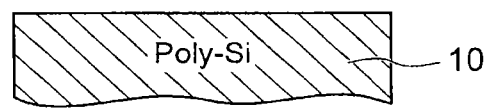
FIG. 25 to FIG. 29 are examples of schematic sectional views illustrating a manufacturing method of a resistive random access memory device according to Embodiment 2.

A titanium nitride (TIN) layer to be upper electrodes UE is then formed on the hafnium oxide ($HfO_x$) film as shown in FIG. 24 by a film formation process that uses the PVD, the CVD, or the ALD.

Bit lines BL (see FIG. 1) are then formed on the titanium nitride (TiN) layer (see FIG. 1).

The processes described above are repeated up to a predetermined number of stages. Consequently, the resistive random access memory device having the planar cross-point type three-dimensional structure shown in FIG. 1 and FIG. 2 is provided.

(ii) Embodiment 2

A manufacturing method of a memory device including the resistance change storage cell shown in FIG. 8 is now described with reference to FIG. 25 to FIG. 30.

Figure 26:
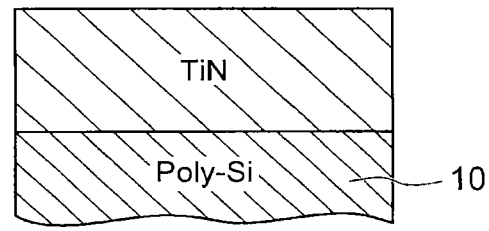

First, word lines WL (see FIG. 1) and current control elements 10 are formed on a substrate S (see FIG. 1), and a titanium nitride (TiN) layer to be lower electrodes LE is then formed on the current control elements 10 as shown in FIG. 26 by the PVD, the CVD, or the ALD.

Figure 27:
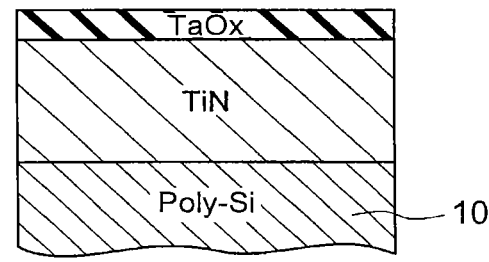

A tantalum oxide ($TaO_x$) layer is then formed on the titanium nitride (TiN) layer as shown in FIG. 27 by a film formation process that uses the PVD, the CVD, or the ALD.

Figure 28:
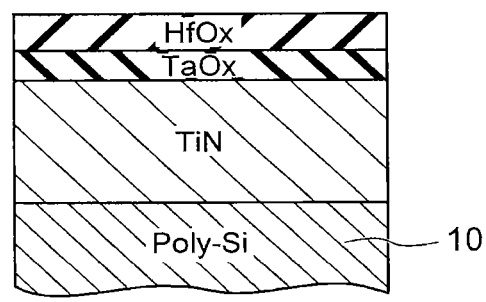

A hafnium oxide ($HfO_x$) film to be resistive switching films RW is then formed on the tantalum oxide ($TaO_x$) layer as shown in FIG. 28 by a film formation process that uses the PVD, the CVD, or the ALD.

Figure 29:
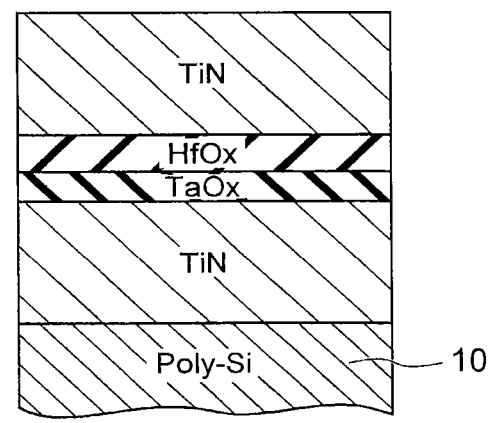
Figure 30:
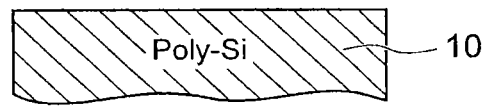
FIG. 30 to FIG. 35 are examples of schematic sectional views illustrating a manufacturing method of a resistive random access memory device according to Embodiment 3.

A titanium nitride (TiN) layer to be upper electrodes UE is further formed on the hafnium oxide ($HfO_x$) film as shown in FIG. 29 by a film formation process that uses the PVD, the CVD, or the ALD.

Bit lines BL (see FIG. 1) are then formed on the titanium nitride (TiN) layer.

The processes described above are repeated up to a predetermined number of stages. Consequently, the resistive random access memory device having the planar cross-point type three-dimensional structure which includes the resistance change storage cell SC20 shown in FIG. 8 is provided.

(iii) Embodiment 3

In the present embodiment, a case is picked up in which the resistance change storage cell SC1 shown in FIG. 3 is turned upside down and then disposed between a current control element 10 and a bit line BL. A manufacturing method in this case is described with reference to FIG. 31 to FIG. 35. In this case, a tantalum nitride (TaN) layer is an upper electrode UE, and a titanium nitride (TiN) layer is a lower electrode LE (see FIG. 34).

First, as in the manufacturing methods according to the embodiments previously described, word lines WL (see FIG. 1) and current control elements 10 (FIG. 30) are formed on a substrate S (see FIG. 1).

Figure 31:
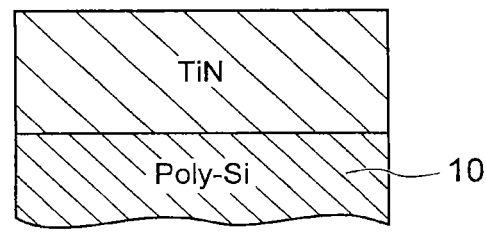

A titanium nitride (TiN) layer is then formed on the current control element 10 as shown in FIG. 31 by a film formation process that uses the PVD, the CVD, or the ALD.

Figure 32:
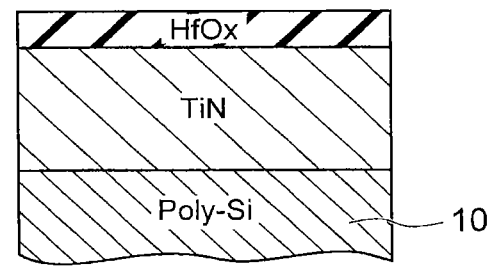

A hafnium oxide ($HfO_x$) film to be resistive switching films RW is then formed on the titanium nitride (TiN) layer as shown in FIG. 32 by the PVD, the CVD, or the ALD.

Figure 33:
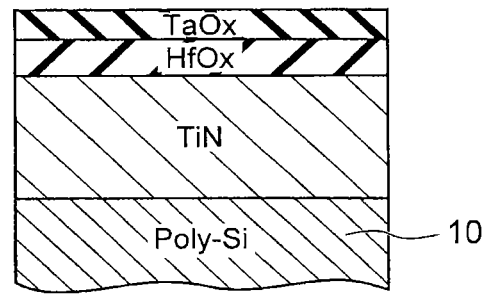

A tantalum oxide ($TaO_x$) layer is then formed on the hafnium oxide ($HfO_x$) film as shown in FIG. 33 by a film formation process that uses the PVD, the CVD, or the ALD.

Figure 34:
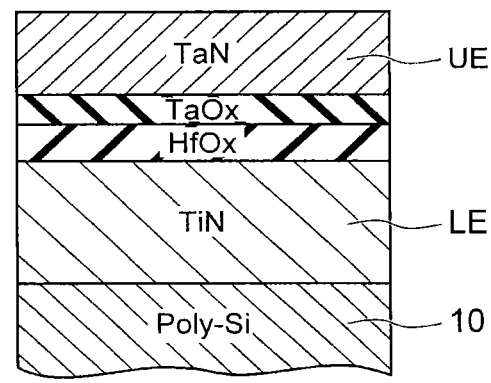

A tantalum nitride (TaN) layer to be upper electrodes UE is further formed on the tantalum oxide ($TaO_x$) layer as shown in FIG. 34 by a film formation process that uses the PVD, the CVD, or the ALD.

Bit lines BL (see FIG. 1) are then formed on the tantalum nitride (TaN) layer.

The processes described above are repeated up to a predetermined number of stages.

Although the tantalum oxide ($TaO_x$) layer is formed on the hafnium oxide ($HfO_x$) film in the processes shown in FIG. 32 and FIG. 33, the tantalum oxide ($TaO_x$) layer can also be formed by an oxidation process at an interface with the tantalum nitride (TaN) layer (see FIG. 21 and FIG. 22).

Figure 35:
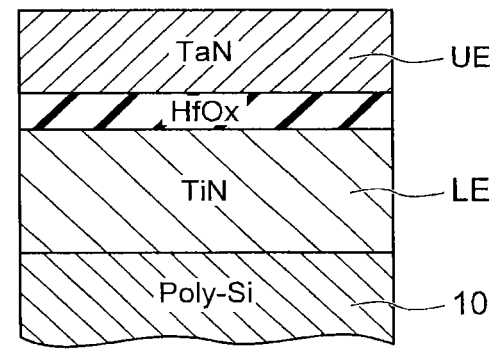

For example, as shown in FIG. 35, the tantalum nitride (TaN) layer may be formed in contact with the hafnium oxide ($HfO_x$) film by a film formation process that uses the PVD, the CVD, or the ALD, and the tantalum oxide ($TaO_x$) layer may then be formed at an interface between the hafnium oxide ($HfO_x$) film and the tantalum nitride (TaN) layer by various annealing processes such as oxidation annealing.

The manufacturing method according to at least one of the embodiments described above allows the above-mentioned resistive random access memory device according to Embodiment 1 to be manufactured in an easy process.

(3) Resistive Random Access Memory Device According to Embodiment 2

Figure 36:
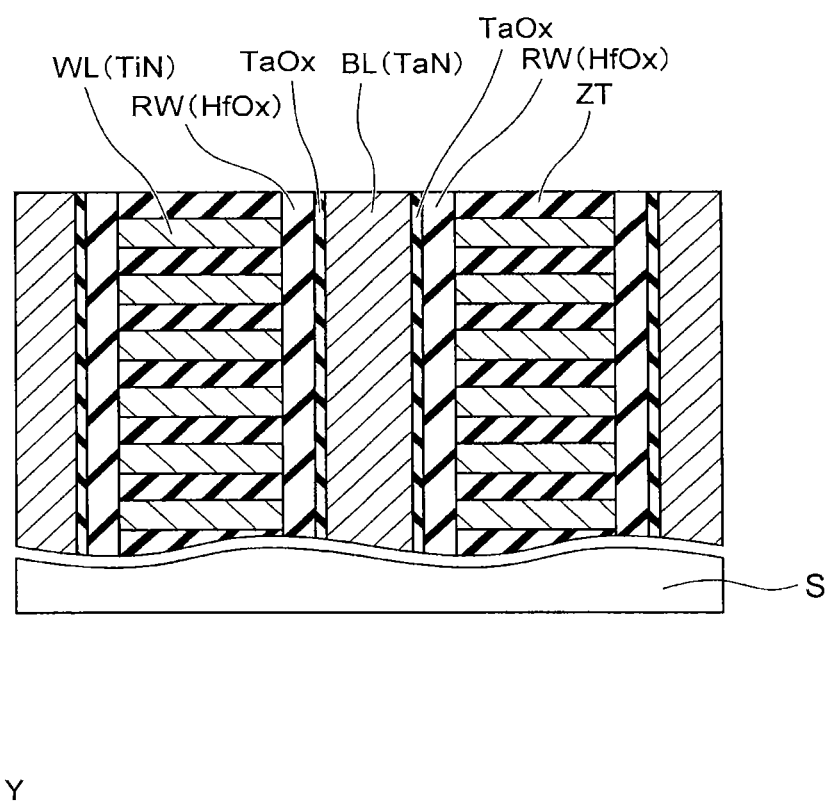
FIG. 36 is an example of a schematic sectional view showing a main part of the resistive random access memory device according to Embodiment 2.

FIG. 36 is a schematic sectional view showing a main part of the resistive random access memory device according to Embodiment 2. The resistive random access memory device according to the present embodiment includes a substrate S, word lines WL made of titanium nitride (TiN), resistive switching films RW made of hafnium oxide (HfO$_x$), tantalum oxide (TaO$_x$) layers, and bit lines BL made of tantalum nitride (TaN).

The word lines WL extend in one direction, in FIG. 36, in the X-direction, in a plane which is level with a main surface 1 (see FIG. 1) of the substrate S, and are repetitively arranged on the substrate S at a predetermined pitch in a Y-direction perpendicular to the X-direction in the main surface 1 of the substrate S. A plurality of stages of the word lines WL are also stacked across interlayer insulating films ZT in a Z-direction which is a direction perpendicular to the main surface 1 of the substrate S.

The bit lines BL extend in the Z-direction, and are repetitively arranged at a predetermined pitch in the X-direction between the word lines WL. Thus, the bit lines BL are arranged in matrix form when viewed from the top.

The resistive switching films RW are formed between the word lines WL and the bit lines BL, respectively. Here, the bit line BL corresponds to the lower electrode LE according to Embodiment 1. The word line WL corresponds to the upper electrode UE according to Embodiment 1. In the present embodiment, the lower electrode LE has tantalum nitride (TaN) formed in the center around which tantalum oxide (TaO$_x$) is formed. That is, the tantalum oxide (TaO$_x$) layer is formed between the resistive switching film RW and the bit line BL, and the surface of the tantalum oxide (TaO$_x$) layer opposite to the bit line BL is in contact with the resistive switching film RW. According to the above structure, the semiconductor device shown in FIG. 36 has what is known as a perpendicular cross-point type three-dimensional structure in which the bit line BL corresponds to a lower electrode, the resistive switching film RW corresponds to a memory layer, tantalum oxide (TaO$_x$) is formed between the resistive switching film RW and the lower electrode, and the word line WL corresponds to an upper electrode, in light of the structure according to Embodiment 1.

In the example shown in FIG. 36, the tantalum oxide (TaO$_x$) layer is formed between the resistive switching film RW and the bit line BL. However, this is not limitation. The tantalum oxide (TaO$_x$) layer can be formed between the word lines WL and the bit line BL.

The word lines WL do not have to be fully made of titanium nitride (TiN), and the part of the word lines WL in contact with the resistive switching films RW may be exclusively made of titanium nitride (TiN).

In the present embodiment as well as in Embodiment 1 above, the thickness of the tantalum oxide (TaO$_x$) layer has only to range from 0.1 nm to 3.0 nm, and preferably range from 0.1 nm to 2.0 nm. The composition ratio between tantalum (Ta) and oxygen (O) in the tantalum oxide (TaO$_x$) layer is preferably close to a stoichiometric value x=2.5.

Although not specifically shown, the material of the bit lines BL is not limited to tantalum nitride (TaN) and may be some other metal such as titanium nitride (TiN), polysilicon doped with an impurity, or tungsten (W), as in the first embodiment described above.

Similarly, although not specifically shown, the material of the word lines WL is not limited to titanium nitride (TiN) either, and may be polysilicon doped with an impurity, or some other metal such as tantalum nitride (TaN), tungsten (W), or tungsten nitride (WN).

A select element (not shown) including, for example, a transistor to select an arbitrary storage cell during reading and writing is formed between the substrate S and the bit lines BL.

It is also possible to form titanium nitride (TiN) as the word lines WL and form tantalum oxide (TaO$_x$) between titanium nitride (TiN) and the resistive switching films RW.

According to the above-described resistive random access memory device in Embodiment 2, it is possible to obtain advantageous effects similar to those in Embodiment 1. Due to the configuration in which one select element (rectifying element) is connected to a plurality of resistive switching elements RW, the resistive random access memory device can be reduced in size.

A manufacturing method similar to that of the resistive random access memory device according to Embodiment 1 can be used as a manufacturing method of the resistive random access memory device according to Embodiment 2. When the bit lines BL are formed after the formation of a stack structure of the word lines WL and the interlayer insulating films ZT, the resistive random access memory device can be easily manufactured by the use of the method described in (iii) Embodiment 3.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A resistive random access memory device, comprising:
a substrate;
first and second wiring lines disposed on the substrate so as to intersect each other; and
a storage cell disposed between the first and second wiring lines at an intersection of the first and second wiring lines, the storage cell comprising
a first electrode electrically connected to the first wiring line,
a resistive switching film on the first electrode,
a second electrode on the resistive switching film, which is electrically connected to the second wiring line, and
a tantalum oxide (TaO$_x$) layer disposed between the first electrode and the resistive switching film, the tantalum oxide (TaO$_x$) layer being in contact with the resistive switching film,
wherein the first electrode extends in a direction perpendicular to a main surface of the substrate, and the second electrode extends in a direction parallel to the main surface of the substrate.

2. The device of claim 1, wherein the tantalum oxide (TaO$_x$) layer has a nearly stoichiometric composition at an interface with the resistive switching film.

3. The device of claim 2, wherein x satisfies the following relation: $2.0 \leq X \leq 2.5$.

4. The device of claim 1, wherein a thickness of the tantalum oxide (TaO$_x$) layer is 0.1 nm to 2.0 nm.

5. The device of claim 1, wherein a material of the first electrode comprises a material selected from the group consisting of tantalum nitride (TaN), titanium nitride (TiN), polysilicon doped with an impurity, tungsten (W), and tungsten nitride (WN).

6. The device of claim 1, wherein a material of the second electrode is selected from the group consisting of titanium nitride (TiN), polysilicon doped with an impurity, tantalum nitride (TaN), tungsten (W), and tungsten nitride (WN).

7. A manufacturing method of a resistive random access memory device, comprising:
  forming a first wiring line on a substrate;
  forming a storage cell on the first wiring line; and
  forming a second wiring line on the storage cell in such a manner that the storage cell is disposed at an intersection of the first wiring line and the second wiring line,
  wherein forming the storage cell comprises
    forming a first electrode on the first wiring line,
    forming a tantalum oxide ($TaO_x$) layer on the first electrode,
    forming a resistive switching film on the tantalum oxide ($TaO_x$) layer, and
    forming a second electrode on the resistive switching film,
  wherein the first electrode is made of tantalum nitride (TaN), the resistive switching film is made of hafnium oxide ($HfO_x$), and the tantalum oxide ($TaO_x$) layer is formed at an interface between the first electrode and the resistive switching film by a heat treatment of the first electrode and the resistive oxide film after the formation of the resistive switching film.

8. The method of claim 7,
  wherein the tantalum oxide ($TaO_x$) layer is formed by a film formation process that uses physical vapor deposition (PVD), chemical vapor deposition (CVD), or atomic layer deposition (ALD), or by oxidizing a surface of the first electrode.

9. The method of claim 8, wherein the oxidizing is conducted by an ozone treatment or an oxidation annealing treatment.

10. The method of claim 7, wherein the tantalum oxide ($TaO_x$) layer is formed between the resistive switching film and the second electrode.

* * * * *